United States Patent [19]
Jung

[11] Patent Number: 6,011,421
[45] Date of Patent: Jan. 4, 2000

[54] SCALABLE LEVEL SHIFTER FOR USE IN SEMICONDUCTOR MEMORY DEVICE

[75] Inventor: Chul-Min Jung, Seoul, Rep. of Korea

[73] Assignee: Samsung Electronics, Co., Ltd., Suwon, Rep. of Korea

[21] Appl. No.: 08/994,911

[22] Filed: Dec. 19, 1997

[30] Foreign Application Priority Data

Dec. 20, 1996 [KR] Rep. of Korea ........................ 96-69195

[51] Int. Cl.[7] ........................................................ H03L 5/00
[52] U.S. Cl. .......................... 327/333; 327/215; 327/219; 326/68; 326/70; 326/81
[58] Field of Search ..................................... 327/199, 210, 327/215, 208, 219, 333; 326/68, 70, 71, 73, 81

[56] References Cited

U.S. PATENT DOCUMENTS

| | | | |
|---|---|---|---|
| 4,695,744 | 9/1987 | Giordano | 327/333 |
| 5,241,225 | 8/1993 | Okajoma et al. | 326/73 |
| 5,659,258 | 8/1997 | Tanabe et al. | 326/68 |
| 5,786,723 | 7/1998 | Kim | 327/333 |

*Primary Examiner*—Terry D. Cunningham
*Assistant Examiner*—Jung Ho Kim
*Attorney, Agent, or Firm*—Marger Johnson & McCollom, P.C.

[57] ABSTRACT

A scalable level shifter which performs at high-speeds and optimizes power consumption. The scalable level shifter receives an input signal and converts the input signal having a scalable voltage level to an output signal having a predetermined voltage level. The scalable level shifter includes a self-resetting circuit connected to an internal power supply for interrupting an internal current path responsive to output signal voltage variations corresponding to voltage transitions of the input signal.

17 Claims, 3 Drawing Sheets

've6,011,421

SCALABLE LEVEL SHIFTER FOR USE IN SEMICONDUCTOR MEMORY DEVICE

BACKGROUND OF THE INVENTION

1. Field of the Invention

The present invention relates to a level shifter functioning as device input buffer for a semiconductor memory device and, more particularly, to a high speed scalable level shifter which optimizes power consumption.

The present application is based on Korean Patent Application No. 69195/1996 which is incorporated herein by reference.

2. Description of the Related Art

Level shifters for converting a signal having an input voltage level into a signal having a predetermined voltage level are commonly used as input buffers in semiconductor memory devices. Semiconductor memory devices which use an internal operating voltage which is typically different than an external or system operating voltage such as static random access memory devices (SRAMs) are in widespread use due in part to the lower operating voltage requirements of modern central processing units. Level shifters which receive a signal having a variable input voltage within a constant range and which shift the variable input voltage to an internal operating voltage level of the semiconductor memory device are called scalable input buffers.

FIG. 1 is a circuit diagram of a conventional scalable level shifter. The level shifter shown in FIG. 1 comprises inverter I1 and a shift latch which includes PMOS transistors 3 and 4 and NMOS transistors 1 and 2. PMOS transistors 3 and 4 are cross-coupled, that is, the gate of PMOS transistor 3 is connected to the drain of PMOS transistor 4. Likewise, the gate of PMOS transistor 4 is connected to the drain of PMOS transistor 3. The source terminals of NMOS transistors 1 and 2 are connected to a second power supply, typically, ground. The gate of NMOS transistor 1 is connected to the input terminal of inverter I1. The gate of NMOS transistor 2 is connected to the output terminal of inverter I1. Inverter I1 includes PMOS transistor 5 and NMOS transistor 6. Inverter I1 receives an address or a data input within a constant range of 1.8–2.5 volts through input terminal AI and a power supply voltage within the same range supplied from an external central processing unit through external power supply voltage input terminal VDDI.

The level shifter shown in FIG. 1 generates a current at a transition interval during which the voltage level of the input terminal AI changes from a logic LOW to a HIGH or from a logic HIGH to a logic LOW. The level shifter of FIG. 1 cuts off the current during a non-transition interval, that is, when the voltage level of the input terminal is not changing logic states. For example, if output signal ai is changed from a logic HIGH to a logic LOW when a logic HIGH is applied to the gate of NMOS transistor 2, PMOS transistor 4 and NMOS transistor 2 turn on allowing current to flow from internal power supply VDD to ground. This current flow results in output aib changing from a logic HIGH to a logic LOW level. It should be apparent to one skilled in the art that there is no need to provide internal power supply VDD to the source of PMOS transistor 4 once output ai has changed to a logic HIGH.

However, since the amount of the current flowing through PMOS transistor 4 and NMOS transistor 2 during the transition interval is proportional to the operating speed of the device, if the current is large, the performance of the chip deteriorates. Moreover, chip size becomes difficult to optimize when internal power supply VDD must be kept within the range of 1.8–2.5 volts. This is so because as internal power supply VDD increases, the driving capability of PMOS transistors 3 and 4 increases making it difficult to rapidly vary the states of outputs ai and aib. In other words, if the gate of PMOS transistor 3 and the gate of PMOS transistor 4 is grounded through either NMOS transistor 2 or 1, respectively, turning on, the voltage difference between the gate of PMOS transistor 3 and the source of PMOS transistor 4 or between the gate of PMOS transistor 4 and the source of PMOS transistor 3 increases making it difficult to rapidly vary outputs aib and ai.

Therefore, a need exists for a high speed scalable level shifter which optimizes power consumption.

SUMMARY OF THE INVENTION

It is an object of the present invention to provide an improved scalable level shifter which overcomes problems associated with prior art scalable level shifters.

It is another object of the present invention to provide a high speed scalable level shifter.

It is yet another object of the present invention to provide a scalable level shifter which optimizes power consumption.

It is yet another object of the present invention to provide a scalable level shifter functioning as an input buffer for a semiconductor memory device which includes a self-resetting function.

In accordance with one aspect of the present invention, a level shifter for converting an input signal provided externally into a signal having a predetermined voltage level includes a self-resetting circuit. The self-resetting circuit is connected to an internal power supply terminal and cuts off an internal current path responsive to an output signal voltage level variation corresponding to a voltage transition of the input signal. Preferably, the level shifter of the present invention converts TTL or ECL voltage levels into CMOS voltage levels. That is, the level shifter receives an input within the range of about 1.8–2.5 volts and amplifies to an output level of up to 3.3 volts.

To achieve these and other objects, a high speed, low power level shifter is provided. The level shifter comprises an inverter circuit having an input terminal for receiving an input signal having a first predetermined voltage level and generating an inverted version of the input signal. The level shifter also includes a first pair of cross-coupled transistors of a first conductivity type having complementary output terminals for providing a first and a second output signals to first and second output terminals, the first output signal being the complement of the second output signal and having a second predetermined voltage level. Further included is a first and a second transistors of a second conductivity type coupled to said first pair of cross-coupled transistors, the first transistor receiving the input signal and the second transistor receiving the inverted version of the input signal. Even further included is a self-reset circuit for cutting off an internal current path from a first power supply to said first pair of cross-coupled transistors responsive to a voltage level transition of the input signal.

Also provided is an input buffer for use in a semiconductor memory device comprising an inverter circuit driven by a scalable voltage power supply for receiving an input signal having a first predetermined voltage level and generating an inverted version of the input signal. The input buffer further includes a first pair of cross-coupled transistors of a first type for generating a first and a second output signals responsive to the input signal and providing the first and second output terminals, the first output signal having a second predetermined voltage level and the second output signal being the substantial complement of the first output signal. Even further included is a first pair of transistors of a second type coupled to said inverter for receiving the input signal and the inverted input signal and a latch coupled to said first pair of cross-coupled transistors for latching the first and second output signals.

The foregoing and other objects, advantages and features of the present invention will become more apparent from the following detailed description with reference to the accompanying drawings, in which like reference numerals or symbols designate like elements or signals. In the following description, numerous specific details are set forth to provide a more thorough understanding of the present invention. It will be apparent, however, to one skilled in the art, that the present invention may be practiced without these specific details.

DETAILED DESCRIPTION OF THE PREFERRED EMBODIMENT

Figure 1:
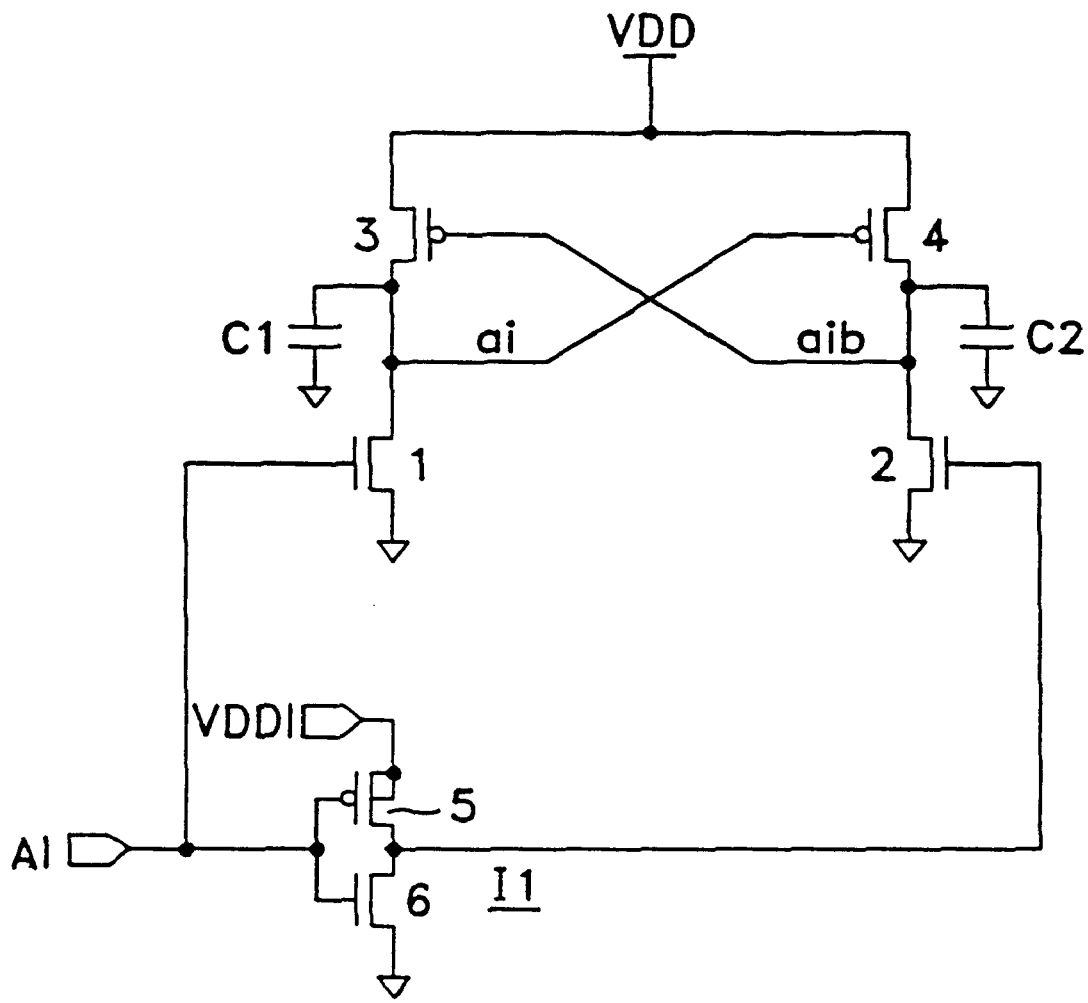
FIG. 1 is a circuit diagram of a conventional scalable level shifter.
Figure 2:
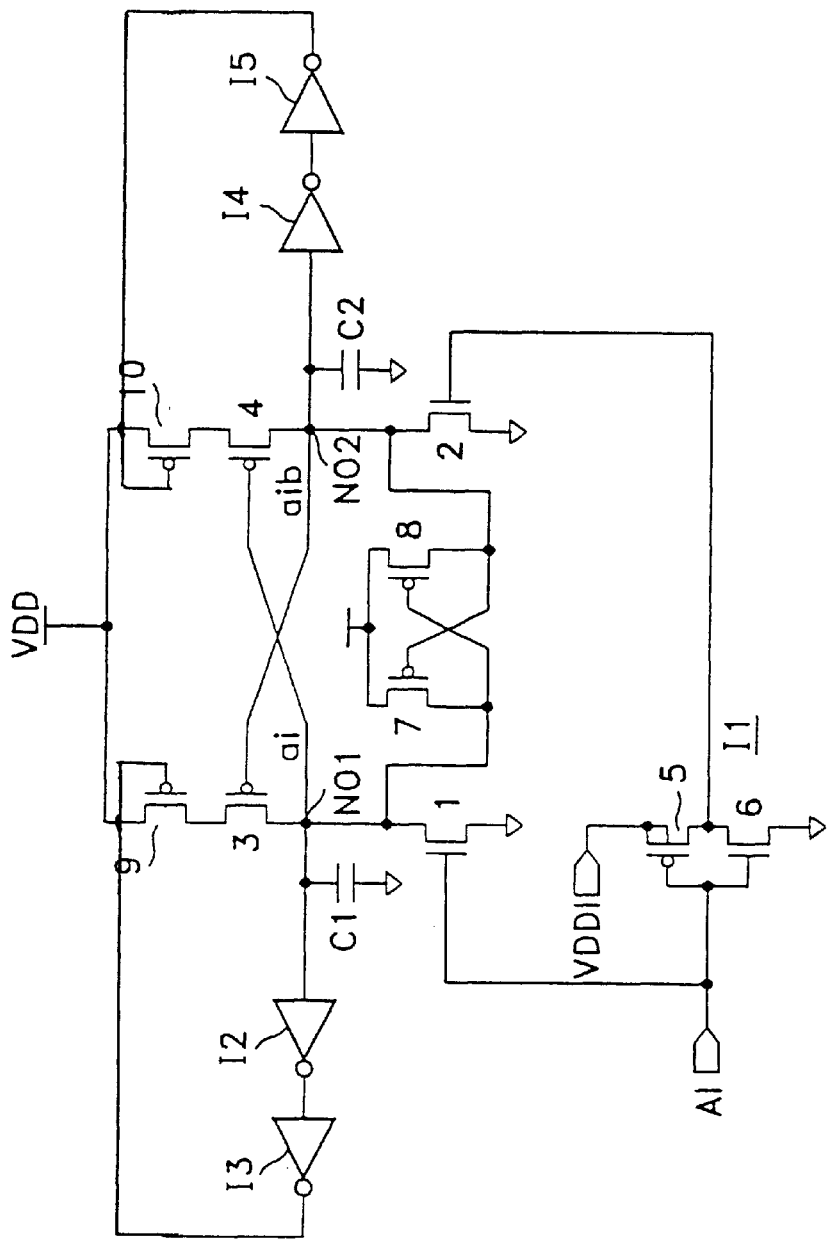
FIG. 2 is a circuit diagram of a scalable level shifter according to the present invention.

The scalable level shifter of the present invention is shown in FIG. 2. Scalable level shifter 100 can be used as an input buffer for an SRAM type memory device. Scalable level shifter 100 includes input terminal AI, inverter I1, first and second NMOS transistors 3 and 4, and first and second PMOS transistors 1 and 2 having a similar construction as that described in reference to the level shifter shown in FIG. 1. That is, input terminal AI receives an external input signal having an input voltage level between 1.8–2.5 volts. Inverter I1, including PMOS transistors 5 and 6 and driven by internal power supply VDD, inverts the external input.

PMOS transistors 3 and 4 are cross-coupled, that is, the gate of PMOS transistor 3 is connected to the drain of PMOS transistor 4. Likewise, the gate of PMOS transistor 4 is connected to the drain of PMOS transistor 3. The source terminals of NMOS transistors 1 and 2 are connected to ground. The gate of NMOS transistor 1 is connected to the input terminal of inverter I1. The gate of NMOS transistor 2 is connected to the output terminal of inverter I1. The drains of transistors 3 and 4 form complementary output terminals for complementary output signals aib and ai, respectively.

Scalable level shifter 100 also includes a self resetting circuit. The self-resetting circuit prevents internal power supply VDD from being supplied to either PMOS transistors 3 or 4 when the voltage level of complementary output signals ai and aib varies responsive to an external input signal voltage transition. The self-resetting circuit includes first and second cut-off PMOS transistors 9 and 10 and first and second delay drivers consisting of serially connected inverters I2 and I3, and I4 and I5, respectively. The first delay driver, consisting of inverters I2 and I3, delays output signal ai for a prescribed time and generates a first reset driving signal. The second delay driver, consisting of inverters I4 and I5, delays complementary output signal aib for a prescribed time and generates a second reset driving signal.

First current cut-off PMOS transistor 9 has a source connected to internal power supply VDD, a drain connected to the source of PMOS transistor 3, and a gate connected to the output terminal of inverter I3 for receiving the first reset driving signal. Second current path cut-off PMOS transistor 10 has a source connected to internal power supply VDD, a drain connected to the source of PMOS transistor 4, and a gate connected to the output terminal of inverter I5 for receiving the second reset driving signal.

Scalable level shifter 100 also includes a latch for preventing voltage level variations of complementary output signals aib and ai caused by the leakage current of NMOS transistors 1 and 2. The latch comprises cross-coupled PMOS transistors 7 and 8 where the gate of PMOS transistor 7 is connected to the source of PMOS transistor 8 which, in turn, is connected to the terminal of output signal aib. Likewise, the gate of PMOS transistor 8 is connected to the source of PMOS transistor 7 which, in turn, is connected to the terminal of output signal ai. The source terminals of PMOS transistors 7 and 8 are connected to internal power supply VDD. Capacitor C1 is connected between the terminal for output signal ai and ground and capacitor C2 is connected between the terminal for complementary output signal aib and ground. Capacitors C1 and C2 represent parasitic line capacitance.

Figure 3:
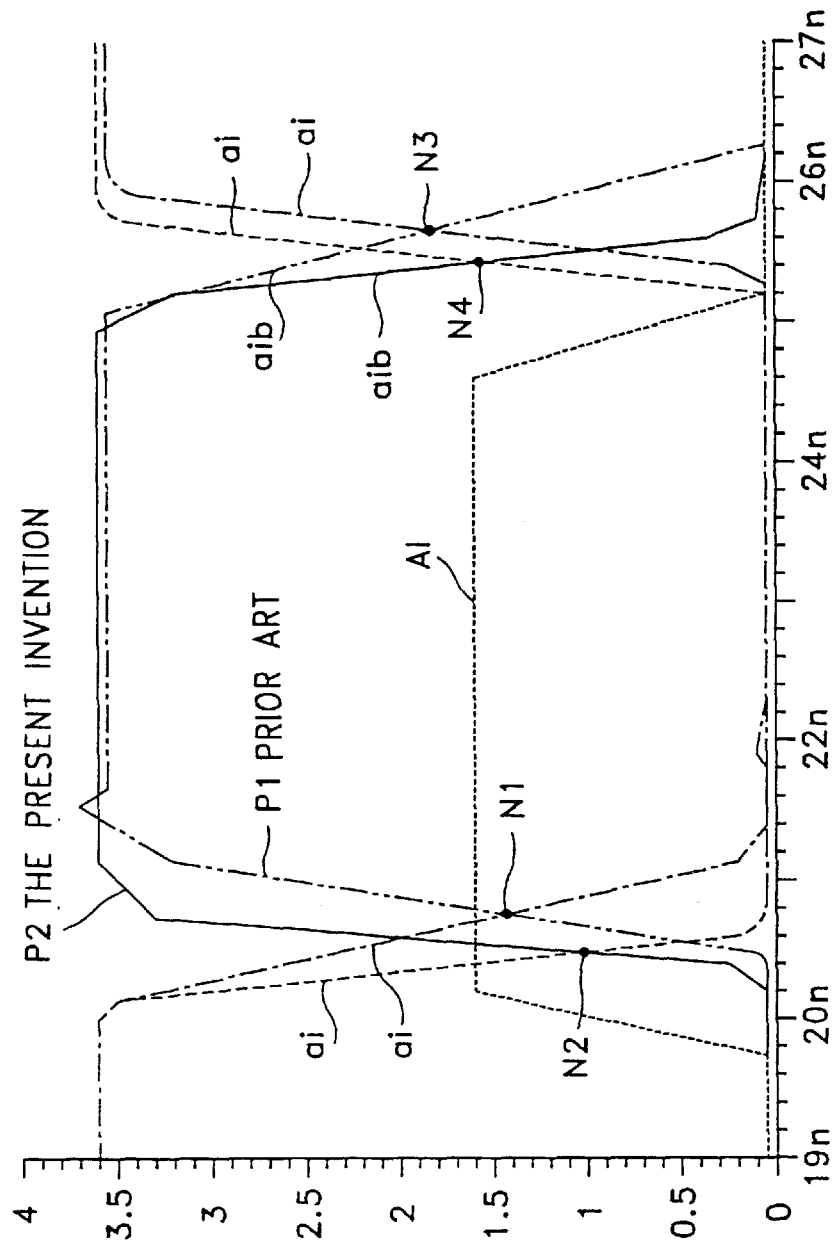
FIG. 3 is a timing chart illustrating output waveforms of the circuits shown in FIGS. 1 and 2.

FIG. 3 is a timing chart of signal waveforms for the circuits of FIGS. 1 and 2. Complementary output signal aib of the circuit of FIG. 1 is shown as waveform P1. Complementary output signal aib of the circuit of FIG. 2 is shown as waveform P2. Nodes N1 and N3 represent the point at which output signal ai intersects output signal aib (shown as waveform P1) in the circuit of FIG. 1. Similarly, nodes N2 and N4 represent the point at which output signal ai intersects output signal aib (shown as waveform P2) in the circuit of FIG. 2. AI is an input signal waveform. As shown in FIG. 3, the transition times at nodes N1, N2, N3, and N4 are 0.68, 0.38, 0.72, and 0.47 nanoseconds, respectively. Therefore, the circuit of FIG. 2 operates at a higher speed than the circuit of FIG. 1.

Referring back to FIG. 2, a variable voltage within the range of 1.8–2.5 volts is supplied to input terminal AI and scalable power supply voltage terminal VDDI. Scalable power supply VDDI is provided by a central processing unit (not shown). CMOS inverter I1 is driven by the scalable power supply voltage VDDI. Inverter I1 provides an inverted external input level to the gate of NMOS transistor 2. Thus, the gate terminals of NMOS transistors 1 and 2 are driven by signals which are the inverse of each other. If the input signal provided to input terminal AI transitions from a logic LOW to a logic HIGH voltage, NMOS transistor 2 turns on while NMOS transistor 1 turns off. Node NO1 is at a logic HIGH and node NO2 is at a logic LOW. Since node NO1 is at a logic HIGH, the output of inverter I2 changes to a logic LOW after a first prescribed time and the output of inverter I3 changes to a logic HIGH after a second prescribed time. The output of inverter I3 is the first reset driving signal and is connected to the gate of PMOS transistor 9. The gate of PMOS transistor 9 receives a logic HIGH first reset driving signal from inverter I3 turning off PMOS transistor 9. Since PMOS transistor 9 is turned off, power supply VDD is not provided to the source of PMOS transistor 3. Therefore, the current path flowing into the source of NMOS transistor 1 from the source of PMOS transistor 9 is cut off.

The circuit operation that results in turning off PMOS transistor 9 is termed the self-resetting operation. The self-resetting operation is needed because once the output ai is set to a logic HIGH, there is no need to supply power supply voltage VDD to the source of PMOS transistor 3. Thus, the current path from power supply VDD is cut off resulting in reduced power consumption. Thereafter, if the voltage level at node NO1 is changed from a logic HIGH to a logic LOW, the driving load of NMOS transistor 1 is greatly reduced since the power supply is not part of the current path in operation. Thus, speed is improved. Meanwhile, the output of inverter I5 is at a logic LOW, turning on PMOS transistor 10 resulting in the current path from power supply VDD to the source of NMOS transistor 2 not being cut-off.

A latch is included in level shifter 100 to prevent voltage variations in complementary outputs ai and aib due to the leakage currents of NMOS transistors 1 and 2. The latch comprises PMOS transistors 7 and 8. PMOS transistors 7 and 8 are cross-coupled, i.e., the gate of PMOS transistor 7 is connected to the drain of PMOS transistor 8 and to the terminal for complementary output signal aib. Likewise, the gate of PMOS transistor 8 is connected to the drain of PMOS transistor 7 and to the terminal for complementary output signal ai. PMOS transistors 7 and 8 have sources commonly connected to a power supply voltage VDD. When complementary output signal ai is at a logic LOW, PMOS transistor 8 turns on, supplying power supply VDD to node NO2 and thus, maintaining output signal aib at a logic HIGH insulated from voltage variations due to leakage in NMOS transistor 2. Likewise, when complementary output signal aib is at a logic LOW, PMOS transistor 7 turns on, supplying power supply VDD to node NO1 and thus, maintaining output signal ai at a logic HIGH insulated from voltage variations due to leakage in NMOS transistor 1. Therefore, the latch circuit including PMOS transistors 7 and 8 latches the level states of output signals ai and aib and compensates for leakage currents preventing voltage variations in output signals ai and aib. PMOS transistors 7 and 8 are preferably small with small transition currents.

The total delay time of inverters I2 and I3 is preferably about 0.5 nanoseconds which limits the operating frequency of scalable level shifter 100. If scalable level shifter 100 receives an input during a delay time that is longer than 0.5 nanoseconds, scalable level shifter 100 might malfunction turning on both PMOS transistor 7 and 8. Since a delay of about 0.5 nanoseconds corresponds to a frequency of 2 gigahertz, scalable level shifter 100 does not malfunction because the a synchronous SRAM typically operates in the range of hundreds of megahertz at maximum.

Therefore, scalable level shifter 100 includes the self-resetting circuit for cutting off the current path in response to voltage level variations in output signals ai and aib corresponding to voltage transitions of the input signal. When converting a TTL (transistor-transistor logic) or ECL (emitter coupled logic) level into a CMOS level, an input within the range of about 1.8–2.5 volts is received at input terminal AI and amplified to about 3.3 volts.

As stated previously, the scalable level shifter having the self-resetting function for cutting off the current path responsive to output terminal voltage variations corresponding to the transition of the input provided herein ensures high speed operation and minimized power consumption.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A level shifter, comprising:

an inverter circuit having an input terminal for generating an inverted version of an input signal, the input signal having a first predetermined voltage level;

a first pair of cross-coupled transistors of a first conductivity type having complementary output terminals for providing a first and a second output signals to first and second output terminals, the first output signal being the complement of the second output signal and having a second predetermined voltage level;

a first and a second transistors of a second conductivity type coupled to said first pair of cross-coupled transistors, the first transistor receiving the input signal and the second transistor receiving the inverted version of the input signal; and a self-reset circuit for cutting off an internal current path from a first power supply to said first pair of cross-coupled transistors responsive to a voltage level transition of the input signal wherein the first predetermined voltage level is a TTL level and the second predetermined voltage level is a CMOS voltage level.

2. A level shifter, comprising:

an inverter circuit having an input terminal for generating an inverted version of an input signal, the input signal having a first predetermined voltage level;

a first pair of cross-coupled transistors of a first conductivity type having complementary output terminals for providing a first and a second output signals to first and second output terminals, the first output signal being the complement of the second output signal and having a second predetermined voltage level;

a first and a second transistors of a second conductivity type coupled to said first pair of cross-coupled transistors, the first transistor receiving the input signal and the second transistor receiving the inverted version of the input signal;

a self-reset circuit for cutting off an internal current path from a first power supply to said first pair of cross-coupled transistors responsive to a voltage level transition of the input signal, the self-reset circuit including:

a first and second delay lines coupled to said first pair of cross-coupled transistors for delaying the first and second output signals by a first and a second delay times, respectively; and a second transistor pair of the first conductivity type coupled to said first and second delay lines for cutting off the current path from the first power supply to said first pair of cross-coupled transistors responsive to the first and second delayed output signals;

wherein the first conductivity type is a P-type and the second conductivity type is an N-type.

3. A level shifter, comprising:

an inverter circuit having an input terminal for generating an inverted version of an input signal, the input signal having a first predetermined voltage level;

a first pair of cross-coupled transistors of a first conductivity type having complementary output terminals for providing a first and a second output signals to first and second output terminals, the first output signal being the complement of the second output signal and having a second predetermined voltage level;

a first and a second transistors of a second conductivity type coupled to said first pair of cross-coupled transistors, the first transistor receiving the input signal and the second transistor receiving the inverted version of the input signal;

a self-reset circuit for cutting off an internal current path from a first power supply to said first pair of cross-coupled transistors responsive to a voltage level transition of the input signal; and a latch circuit coupled to said first and second transistors for latching the first and second output signals.

4. The level shifter of claim 3 wherein the first predetermined voltage level is an ECL level and the second predetermined voltage level is a CMOS voltage level.

5. The level shifter of claim 2 wherein the first delay line includes a first and second serially connected inverters.

6. The level shifter of claim 5 wherein the second delay line includes a third and fourth serially connected inverters.

7. The level shifter of claim 3 wherein the latch circuit includes a second pair of cross-coupled transistors of the first conductivity type connected between the first power supply and said first pair of cross-coupled transistors.

8. The level shifter of claim 7 wherein the first conductivity type is a P-type and wherein the second conductivity type is a N-type.

9. An input buffer for use in a semiconductor memory device, comprising:

an inverter circuit driven by a voltage power supply for receiving an input signal having a first predetermined voltage level and generating an inverted version of the input signal;

a first pair of cross-coupled transistors of a first type for generating a first and a second output signals responsive to the input signal and providing the first and second output terminals, the first output signal having a second predetermined voltage level and the second output signal being the substantial complement of the first output signal;

a first pair of transistors of a second type coupled to said inverter for receiving the input signal and the inverted input signal; and a latch coupled to said first pair of cross-coupled transistors for latching the first and second output signals;

wherein the latch includes a second pair of cross-coupled transistors of the first type connected between a first power supply and the first and second output terminals.

10. An input buffer for use in a semiconductor memory device comprising:

an inverter circuit driven by a voltage power supply for receiving a input signal having a first predetermined voltage level and generating an inverted version of the input signal;

a first pair of cross-coupled transistors of a first type for generating a first and a second output signals responsive to the input signal and providing the first and second output terminals, the first output signal having a second predetermined voltage level and the second output signal being the substantial complement of the first output signal;

a first pair of transistors of a second type coupled to said inverter for receiving the input signal and the inverted input signal;

a latch coupled to said first pair of cross-coupled transistors for latching the first and second output signals; and a self-reset circuit coupled to said first pair of cross-coupled transistors for opening a current path between a first power supply and said pair of cross-coupled transistors responsive to voltage transition of the input signal.

11. The input buffer of claim 10 wherein the self-reset circuit includes a first pair of serially connected inverters and a second pair of serially connected inverters, the first pair of inverters for delaying the first output signal and the second pair of inverters for delaying the second output signal.

12. The input buffer of claim 11 wherein the self-reset circuit includes a second pair of transistors of the first type connected between said first pair of cross-coupled transistors and the first power supply for opening the current path between the first power supply and the said first pair of cross-coupled transistors.

13. The input buffer of claim 9 wherein the first type transistor is a PMOS transistor and wherein the second type is an NMOS transistor.

14. The input buffer of claim 9 wherein said inverter circuit includes a first and a second transistors each having a gate, a source, and a drain, the source of the first transistor receiving the voltage power supply, the drain of the first transistor connected to the source of the second transistor, the gates of the first and second transistors receiving the input signal, and the drain of the second transistor for receiving a ground voltage.

15. A method for shifting a voltage level of an input signal from a first predetermined voltage level to a second predetermined voltage level for use in a semiconductor memory device, the method comprising:

receiving the input signal having a first predetermined voltage level;

inverting the input signal;

providing the input signal to a first transistor having a second conductivity type;

providing the inverted version of the input signal to a second transistor having the second conductivity type;

generating a first and a second output signal by shifting the input signal from the first predetermined voltage level to the second predetermined voltage level responsive to the input signal using a first pair of cross-coupled transistors having a first conductivity type, the first pair of cross-coupled transistors being coupled to the first and second transistors, the first output signal being the substantial complement of the second output signal;

providing the first and second output signal to first and second output terminals using the first pair of cross-coupled transistors having a first conductivity type,;

cutting off a current path from a first power supply to the first pair of cross-coupled transistors responsive to a voltage transition of the input signal using a self-reset circuit; and latching the first and second output signals using a latch circuit coupled to the first and second transistors.

16. The method for shifting a voltage level of an input signal of claim 15 including delaying the first and second output signals to respectively generate a first and second reset signals and wherein cutting off a current path from a first power supply includes cutting off the current path from the first power supply responsive to the first and second reset signals.

17. The level shifter of claim 2 wherein the first predetermined voltage level is an ECL level and the second predetermined voltage level is a CMOS voltage level.

* * * * *